United States Patent
Kim et al.

(10) Patent No.: US 9,963,343 B2
(45) Date of Patent: May 8, 2018

(54) TRANSITION METAL DICHALCOGENIDE ALLOY AND METHOD OF MANUFACTURING THE SAME

(71) Applicant: INDUSTRY-ACADEMIC COOPERATION FOUNDATION, YONSEI UNIVERSITY, Seoul (KR)

(72) Inventors: Hyungjun Kim, Seoul (KR); Kyung Yong Ko, Seoul (KR); Kyunam Park, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days. days.

(21) Appl. No.: 15/421,496

(22) Filed: Feb. 1, 2017

(65) Prior Publication Data

US 2017/0267527 A1  Sep. 21, 2017

(30) Foreign Application Priority Data

Mar. 15, 2016  (KR) .................. 10-2016-0031157

(51) Int. Cl.
   *C01B 19/00* (2006.01)
   *C23C 16/30* (2006.01)
   *C23C 16/455* (2006.01)

(52) U.S. Cl.
   CPC .......... *C01B 19/002* (2013.01); *C23C 16/305* (2013.01); *C23C 16/45525* (2013.01); *C23C 16/45531* (2013.01)

(58) Field of Classification Search
   CPC . C23C 16/305; C23C 16/45527; C23C 16/52; C23C 16/455252; C01G 39/06; H01L 21/02422; H01L 21/02568; H01L 21/0262; C01B 19/002
   USPC .......................................................... 252/500
   See application file for complete search history.

(56) References Cited

U.S. PATENT DOCUMENTS

2007/0234949 A1* 10/2007 Ahn ...................... C23C 16/407
                                                    117/88
2015/0118487 A1*  4/2015 Wolden ............... C03C 17/3464
                                                    428/336

FOREIGN PATENT DOCUMENTS

KR         101535573 B1      7/2015

OTHER PUBLICATIONS

Anand et al."Optical and Mott-Schottky Studies of Ternary MoSSe Thin Films Synthesized by Electrochmical Route". World Applied Sciences Journal 21. Published 2013. Total pp. 8.*
Honglai Li et al., "Growth of Alloy $MoS_{2x}Se_{2(1-x)}$ Nanosheets with Fully Tunable Chemical Compositions and Optical Properties", Journal of the American Chemical Society, 2014, pp. 3756-3759, vol. 136, No. 10.

(Continued)

*Primary Examiner* — Harold Pyon
*Assistant Examiner* — Danny N Kang
(74) *Attorney, Agent, or Firm* — Sughrue Mion, PLLC

(57) ABSTRACT

Disclosed are a transition metal dichalcogenide alloy and a method of manufacturing the same. A method of manufacturing a transition metal dichalcogenide alloy according to an embodiment of the present disclosure includes a step of depositing transition metal dichalcogenide on a substrate using atomic layer deposition (ALD); and a step of forming a transition metal dichalcogenide alloy by thermally treating the transition metal dichalcogenide with a sulfur compound.

10 Claims, 6 Drawing Sheets

(56) References Cited

OTHER PUBLICATIONS

Su et al., "Controllable synthesis of band-gap-tunable and monolayer transition-metal dichalcogenide alloys", Frontiers in Energy Research, Jul. 8, 2014, pp. 1-8, vol. 2, Article 27.
Communication dated Feb. 14, 2017 from the Korean Intellectual Property Office in counterpart application No. 10-2016-0031157.

* cited by examiner

[FIG. 1A]
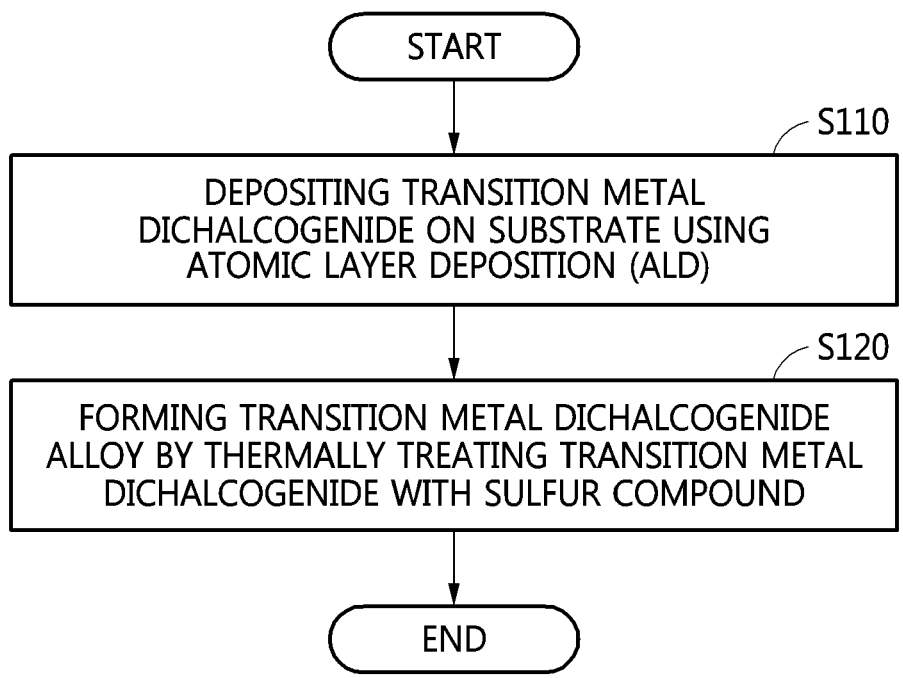

[FIG. 1B]
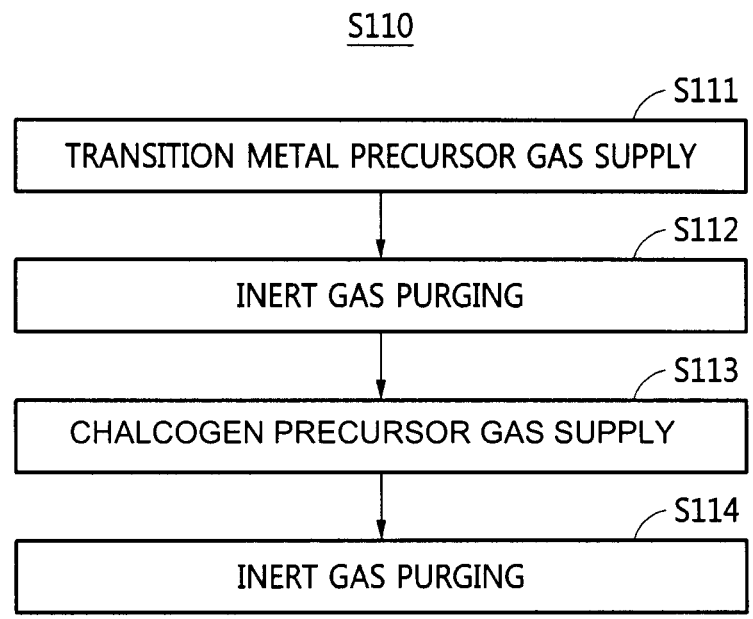

[FIG. 2A]
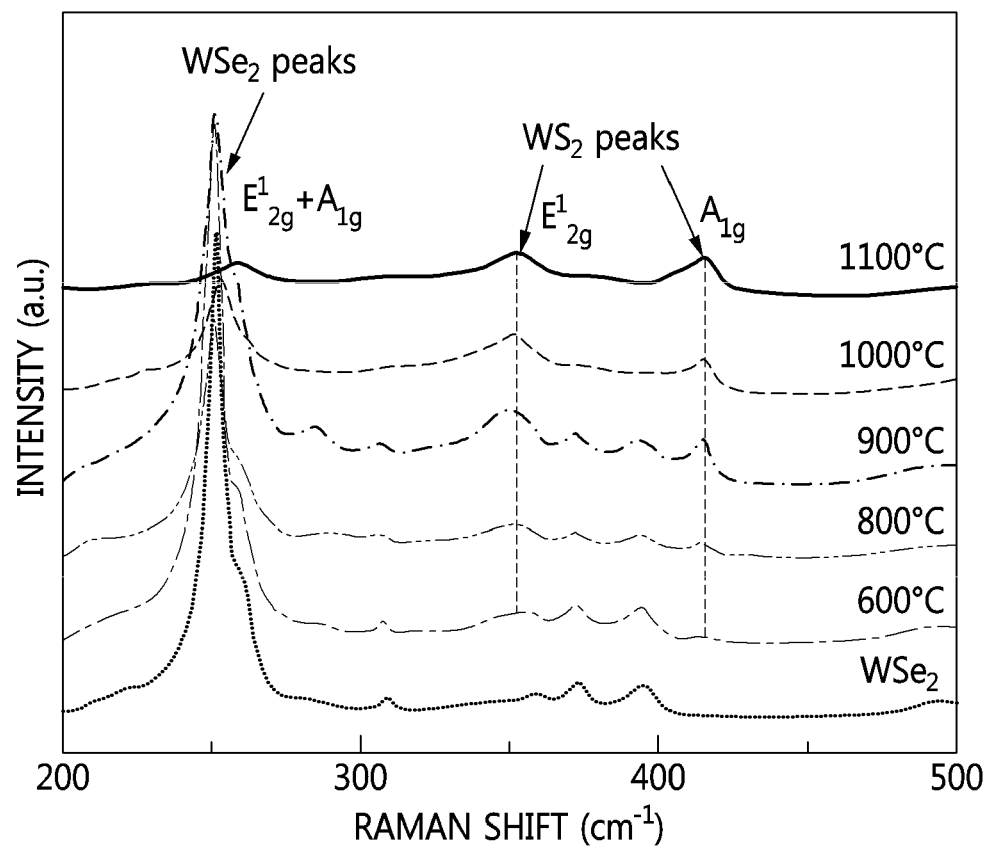

【FIG. 2B】
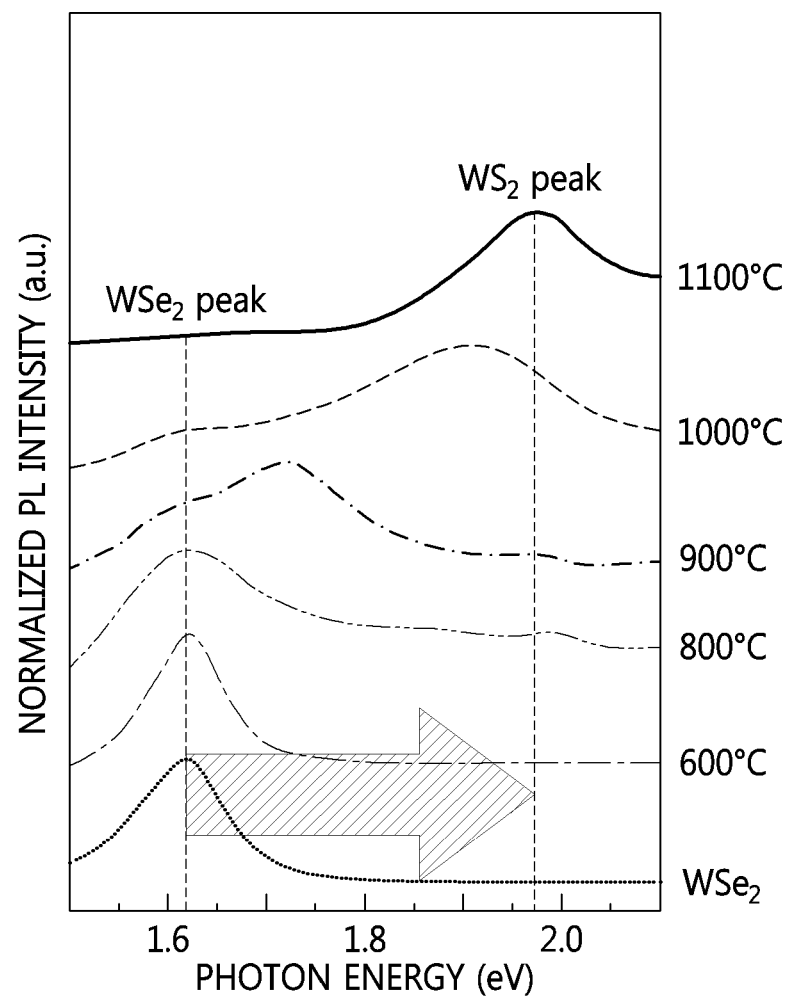

[FIG. 3]
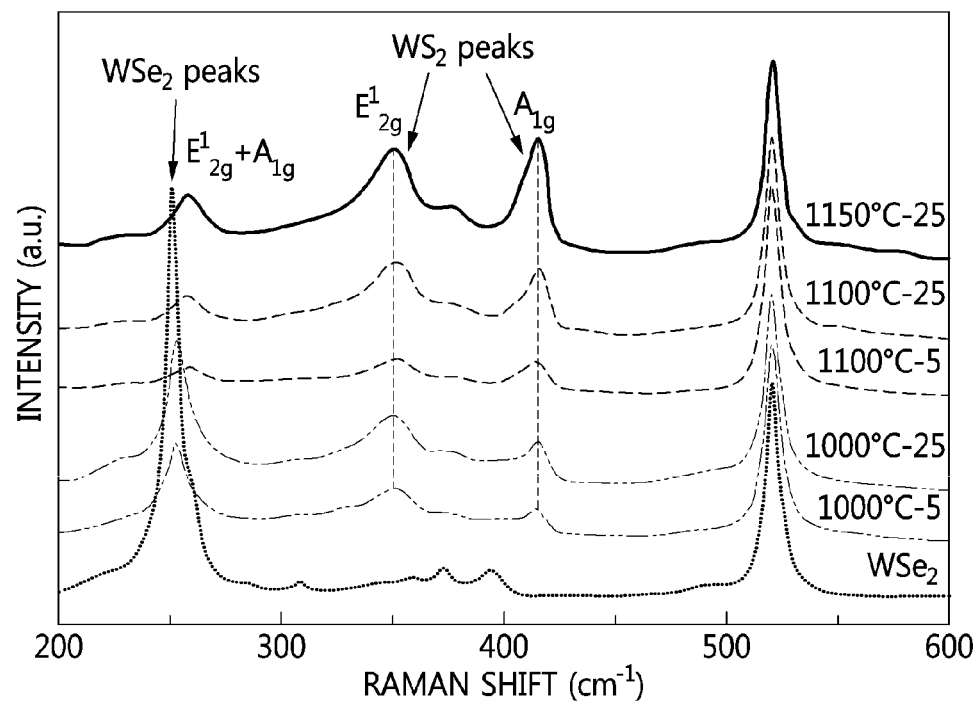

[FIG. 4]
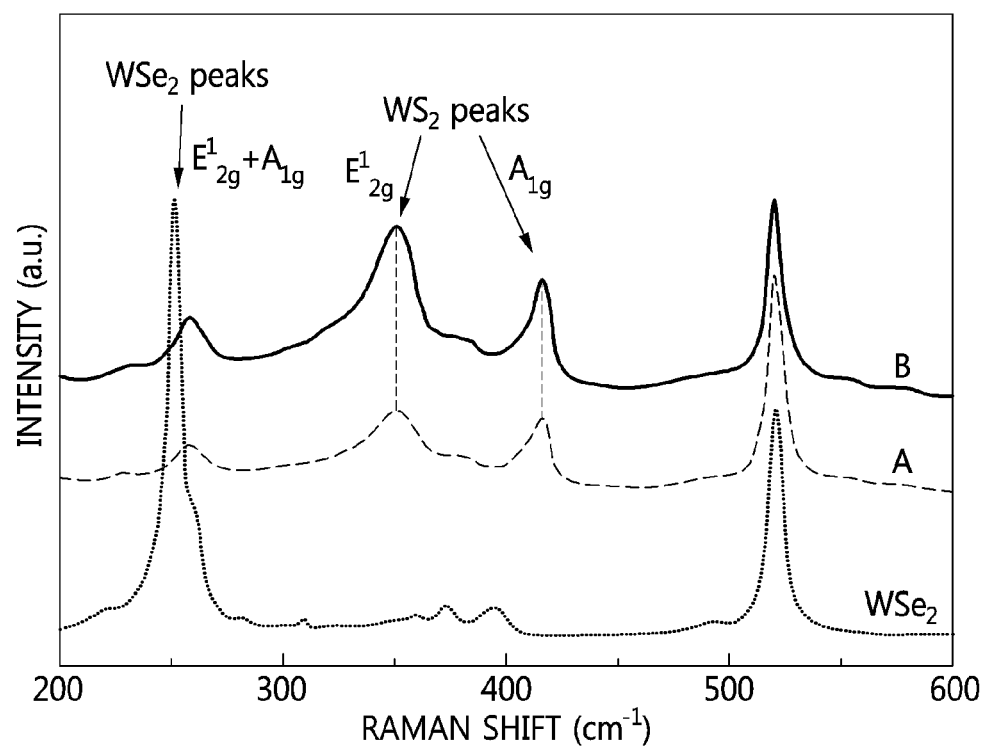

TRANSITION METAL DICHALCOGENIDE ALLOY AND METHOD OF MANUFACTURING THE SAME

CROSS-REFERENCE TO RELATED APPLICATION

This application claims the priority benefit of Korean Patent Application No. 10-2016-0031157, filed on Mar. 15, 2016 in the Korean Intellectual Property Office, the disclosure of which is incorporated herein by reference.

BACKGROUND OF THE INVENTION

Field of the Invention

The present disclosure relates to a transition metal dichalcogenide alloy and a method of manufacturing the same, and more particularly, to a transition metal dichalcogenide alloy formed by thermally treating a transition metal dichalcogenide, which is formed on a substrate by atomic layer deposition (ALD), using a sulfur compound, and a method of manufacturing the same.

Description of the Related Art

Transition metal dichalcogenides (TMDCs or TMDs), which are compounds of transition metals and chalcogenides, are nanomaterials having a two-dimensional structure similar to graphene.

Transition metal dichalcogenides have n atomic layers with very thin thickness and thus have properties such as flexibility and transparency. Due to such properties, transition metal dichalcogenides have attracted attention as materials of next-generation application devices such as optical devices, or electronic devices in which a band gap is controlled.

Accordingly, research into transition metal dichalcogenides, such as $MoS_2$, $WS_2$, $MoSe_2$, and $WSe_2$, having a thickness of one atom is actively underway.

Such transition metal dichalcogenides have a band gap of 1 eV to 2 eV. Recently, research into control of a band gap by using transition metal-sulfide alloy technology in alloying transition metals is underway.

Meanwhile, a thin alloy film of $WS_{2x}Se_{(2-2x)}$ and $MoS_{2x}Se_{(2-2x)}$, synthesized by chemical vapor deposition (CVD), has been reported. However, such a thin alloy film has drawbacks such as difficulties in controlling the thickness thereof and in synthesizing a uniform large area and discontinuity of the thin film.

Therefore, there is a need for development of technology to manufacture a transition metal dichalcogenide (sulfide) alloy, such as $WS_{2x}Se_{(2-2x)}$ or $MoS_{2x}Se_{(2-2x)}$, uniformly over a large area.

RELATED DOCUMENTS

Patent Document

Growth of Alloy $MoS_{2x}Se_{2(1-x)}$ Nanosheets with Fully Tunable Chemical Compositions and Optical Properties, Journal of the American Chemical Society, v. 136 no. 10, 2014, pp. 3756-3759

SUMMARY OF THE INVENTION

Therefore, the present invention has been made in view of the above problems, and it is an object of the present invention to provide a transition metal dichalcogenide alloy formed by thermally treating a transition metal dichalcogenide, which is formed on a substrate by atomic layer deposition (ALD), using a sulfur compound, and a method of manufacturing the same.

In accordance with the present invention, the above and other objects can be accomplished by the provision of a method of manufacturing a transition metal dichalcogenide alloy according to an embodiment of the present disclosure, the method including: a step of depositing transition metal dichalcogenide on a substrate using atomic layer deposition (ALD); and a step of forming a transition metal dichalcogenide alloy by thermally treating the transition metal dichalcogenide with a sulfur compound.

In the method of manufacturing a transition metal dichalcogenide alloy according to an embodiment of the present disclosure, the transition metal dichalcogenide may be composed of any one transition metal, which is selected from the group consisting of tungsten (W), molybdenum (Mo), and hafnium (Hf), and any one chalcogen, which is selected from selenium (Se) and tellurium (Te).

In addition, in the method of manufacturing a transition metal dichalcogenide alloy according to an embodiment of the present disclosure, the sulfur compound may be any one selected from the group consisting of hydrogen sulfide ($H_2S$), dimethyl sulfide, diethyl sulfide, and dimethyl disulfide.

In the method of manufacturing a transition metal dichalcogenide alloy according to an embodiment of the present disclosure, the atomic layer deposition may be thermal atomic layer deposition (thermal ALD) or plasma enhanced atomic layer deposition (PEALD).

In the method of manufacturing a transition metal dichalcogenide alloy according to an embodiment of the present disclosure, the thermally treating of the transition metal dichalcogenide may be performed at 600° C. to 1,200° C.

In addition, the thermally treating of the transition metal dichalcogenide may be performed for 10 minutes to 120 minutes.

In the step of forming a transition metal dichalcogenide alloy by thermally treating the transition metal dichalcogenide with a sulfur compound of the method of manufacturing a transition metal dichalcogenide alloy according to an embodiment of the present disclosure, hydrogen ($H_2$) gas may be additionally supplied.

In addition, the sulfur compound may be supplied at a rate of 10 sccm to 100 sccm, and the hydrogen ($H_2$) gas may be supplied at a rate of 10 sccm to 100 sccm.

In accordance with another aspect of the present invention, there is provided a transition metal dichalcogenide alloy manufactured by the method according to an embodiment of the present disclosure, the transition metal dichalcogenide alloy having a composition represented by Formula 1 below:

$$TS_{2x}C_{2-2x}, \qquad \text{<Formula 1>}$$

wherein T is tungsten (W), molybdenum (Mo), or hafnium (Hf),
S is sulfur (S),
C is selenium (Se) or tellurium (Te), and
x is 0.05 to 0.95.

BRIEF DESCRIPTION OF THE DRAWINGS

The above and other objects, features and other advantages of the present invention will be more clearly understood from the following detailed description taken in conjunction with the accompanying drawings, in which:

FIG. 1A illustrates a flowchart of a preparation method of a transition metal dichalcogenide alloy according to an embodiment of the present disclosure, and FIG. 1B illustrates a flowchart of a preparation method of transition metal dichalcogenide according to an embodiment of the present disclosure;

FIGS. 2A and 2B are graphs illustrating Raman spectrum and change in optical band gap, according to temperature, when a transition metal dichalcogenide alloy according to an embodiment of the present disclosure is thermally treated in a sulfur compound atmosphere;

FIG. 3 illustrates Raman spectrum according to the partial pressure of hydrogen gas when a transition metal dichalcogenide alloy according to an embodiment of the present disclosure is thermally treated in a sulfur compound atmosphere; and FIG. 4 illustrates Raman spectrum according to the partial pressure of a sulfur compound when a transition metal dichalcogenide alloy according to an embodiment of the present disclosure is thermally treated in a sulfur compound atmosphere.

DETAILED DESCRIPTION OF THE INVENTION

Hereinafter, the embodiments of the present invention are described with reference to the accompanying drawings and the description thereof but are not limited thereto.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "includes" and/or "including," when used in this specification, specify the presence of stated features, steps, operations, elements, and/or components, but do not preclude the presence or addition of one or more other features, steps, operations, elements, components, and/or groups thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

Further, as used in the description of the invention and the appended claims, the singular forms "a", "an" and "the" are intended to include the plural forms as well, unless context clearly indicates otherwise.

Furthermore, when an element such as a layer, a film, a region, and a constituent is referred to as being "on" another element, the element can be directly on another element or an intervening element can be present.

The present disclosure relates to a transition metal dichalcogenide alloy and a method of manufacturing the same. More particularly, a transition metal dichalcogenide alloy, which is formed by thermally treating transition metal dichalcogenide deposited on a substrate by atomic layer deposition (ALD), using a sulfur compound, and a method of manufacturing the same are disclosed.

According to an embodiment of the present disclosure, transition metal dichalcogenide may be deposited on a substrate uniformly over a large area by atomic layer deposition (ALD). In addition, due to the characteristics of atomic layer deposition, the thickness of the transition metal dichalcogenide may be easily controlled.

According to another embodiment of the present disclosure, a transition metal dichalcogenide alloy may be manufactured by thermally treating the transition metal dichalcogenide, which has been deposited uniformly over a large area, with a sulfur compound.

In addition, by controlling a condition of the thermal treatment with a sulfur compound, an ingredient ratio in the transition metal dichalcogenide alloy may be easily controlled. Accordingly, a band gap of the transition metal dichalcogenide alloy may be finely controlled.

Hereinafter, a transition metal dichalcogenide alloy according to an embodiment of the present disclosure and a method of manufacturing the same are described in detail with reference to the following examples and the accompanying drawings.

FIG. 1A illustrates a flowchart of a preparation method of a transition metal dichalcogenide alloy according to an embodiment of the present disclosure.

As illustrated in FIG. 1A, a method of manufacturing a transition metal dichalcogenide alloy according to an embodiment of the present disclosure includes a step of depositing transition metal dichalcogenide on a substrate using atomic layer deposition (ALD) (S110); and a step of forming a transition metal dichalcogenide alloy by thermally treating the transition metal dichalcogenide with a sulfur compound (S120).

In S110 of the method of manufacturing the transition metal dichalcogenide alloy according to an embodiment of the present disclosure, the atomic layer deposition (ALD) may be thermal atomic layer deposition (thermal ALD) or plasma enhanced atomic layer deposition (Plasma Enhanced ALD, PEALD).

In particular, thermal ALD is characterized in that thermal energy is involved in reaction between a precursor and a reactant. PEALD is a method causing reaction between a precursor and a reactant, using plasma and PEALD may be performed at a relatively low temperature compared to thermal ALD.

FIG. 1B illustrates a flowchart of a preparation method of transition metal dichalcogenide according to an embodiment of the present disclosure.

Referring to FIG. 1B, S110 of the method of manufacturing the transition metal dichalcogenide alloy according to an embodiment of the present disclosure may include a transition metal precursor gas supply step (S111), an inert gas purging step (S112), a chalcogen precursor gas supply step (S113), and an inert gas purging step (S114). In addition, S111 to S114 of S110 may be repeated several times.

The transition metal precursor gas supply step (S111) is performed by supplying transition metal precursor gas into an atomic layer deposition chamber. The transition metal precursor may be transported by inert gas.

For example, the transition metal precursor may be $WCl_6$, $MoCl_5$, $Mo(CO)_6$, or the like and the flow rate of the transition metal precursor gas may be 10 sccm to 100 sccm. In addition, an interior temperature of the atomic layer deposition chamber may be, without being limited to, 500° C. to 900° C.

In the inert gas purging step (S112), gas which has not been removed in the transition metal precursor gas supply step (S111) may be removed.

In the chalcogen precursor gas supply step (S113), the chalcogen precursor may be, for example, dimethyl selenide, diethyl selenide, diethyl diselenide, or the like.

By the inert gas purging step (S114), the chalcogen precursor and by-products which have not been removed in the chalcogen precursor gas supply step (S113) and remain in the atomic layer deposition chamber, may be removed.

According to an embodiment of the present disclosure, the transition metal dichalcogenide may be deposited on a substrate to a large area and uniform by atomic layer deposition such as thermal ALD or PEALD. In addition, the thickness of the transition metal dichalcogenide may be easily controlled due to the characteristics of atomic layer deposition.

The transition metal dichalcogenide deposited on a substrate by atomic layer deposition according to an embodiment of the present disclosure may be a transition metal dichalcogenide consisting of any one transition metal, selected from the group consisting of tungsten (W), molybdenum (Mo), and hafnium (Hf), and any one chalcogen, which is selected from selenium (Se) and tellurium (Te).

In particular, the transition metal dichalcogenide according to an embodiment of the present disclosure may be $WSe_2$, $WTe_2$, $MoSe_2$, $MoTe_2$, $HfSe_2$, or $HfTe_2$.

In S120 of the method of manufacturing the transition metal dichalcogenide alloy according to an embodiment of the present disclosure, a transition metal dichalcogenide alloy is formed by thermally treating the transition metal dichalcogenide with a sulfur compound.

In particular, in S120 according to an embodiment of the present disclosure, a transition metal dichalcogenide alloy, in which the transition metal dichalcogenide is sulfurated, is formed by thermally treating the transition metal dichalcogenide, which has been formed by S110, with a compound containing sulfur.

In S120 of the method of manufacturing the transition metal dichalcogenide alloy according to an embodiment of the present disclosure, the sulfur compound refers to gas including sulfur. For example, the sulfur compound may be hydrogen sulfide ($H_2S$), dimethyl sulfide, diethyl sulfide, or dimethyl disulfide, particularly hydrogen sulfide ($H_2S$).

The sulfur compound may be supplied at a rate of 10 sccm to 100 sccm, particularly 10 sccm to 50 sccm. For example, hydrogen sulfide ($H_2S$) may be supplied at a rate of 10 sccm to 100 sccm.

In S120 of the method of manufacturing the transition metal dichalcogenide alloy according to an embodiment of the present disclosure, hydrogen ($H_2$) gas, other than the sulfur compound, may be additionally supplied. In addition, inert gas may additionally supplied thereto. The inert gas may be, for example, argon (Ar) gas.

The hydrogen (H2) gas may be supplied at a rate of 10 sccm to 100 sccm, particularly 20 sccm to 50 sccm. The inert gas may be supplied to 5 sccm to 100 sccm, particularly 20 sccm to 50 sccm.

In S120 of the method of manufacturing the transition metal dichalcogenide alloy according to an embodiment of the present disclosure, the thermal treatment may be performed at 600° C. to 1,200° C., particularly 900° C. to 1,100° C.

In addition, the thermal treatment may be performed for 10 minutes to 120 minutes, particularly 30 minutes to 60 minutes.

For example, in S120 of the present disclosure, the transition metal dichalcogenide formed by S110 may be thermally treated at 1,100° C. for 30 minutes in a sulfur compound atmosphere at 20 sccm, at a hydrogen gas supply rate of 25 sccm, and in an inert gas atmosphere at 50 sccm.

A transition metal dichalcogenide alloy, an ingredient ratio of which has been easily controlled, may be manufactured by thermally treating the transition metal dichalcogenide, which has been formed on a substrate by atomic layer deposition, with a sulfur compound according to an embodiment of the present disclosure.

In particular, an ingredient ratio of the transition metal dichalcogenide alloy may be easily controlled by, when the transition metal dichalcogenide is thermally treated with a sulfur compound, controlling a process condition such as a temperature condition of the thermal treatment, a partial pressure condition of the sulfur compound, or a partial pressure condition of the hydrogen gas.

In addition, since an ingredient ratio of the transition metal dichalcogenide alloy may be easily controlled, a band gap of the transition metal dichalcogenide alloy may be controlled. The band gap may be finely controlled in a range of 1.62 eV to 1.97 eV.

In addition, since a band gap of the transition metal dichalcogenide alloy manufactured according to an embodiment of the present disclosure may be easily controlled, the transition metal dichalcogenide alloy may be applied to a channel layer of a transistor, an active layer of a solar cell, and the like. In particular, the transition metal dichalcogenide alloy according to an embodiment of the present disclosure may be usefully applied also to flexible devices.

Hereinafter, compositional characteristics of the transition metal dichalcogenide alloy according to an embodiment of the present disclosure are described with reference to FIGS. 2A to 4.

FIGS. 2A and 2B are graphs illustrating Raman spectrum and change in optical band gap, according to temperature conditions, when a transition metal dichalcogenide alloy according to an embodiment of the present disclosure is thermally treated in a sulfur compound atmosphere.

In particular, Raman spectrum of the transition metal dichalcogenide alloy ($WSe_{2x}S_{2-2x}$) manufactured by thermally treating transition metal dichalcogenide ($WSe_2$), which has been formed by atomic layer deposition according to an embodiment of the present disclosure, with a sulfur compound ($H_2S$) varying temperature from 600° C. to 1,100° C. is illustrated in FIG. 2A, and change in optical band gap thereof is illustrated in FIG. 2B.

Here, the thermal treatment using a sulfur compound ($H_2S$) was performed for 30 minutes in a hydrogen sulfide ($H_2S$) atmosphere at 10 sccm, in a hydrogen gas atmosphere at 5 sccm, and in at an argon gas supply rate of 50 sccm, other than the aforementioned temperature conditions. However, when a temperature was 600° C., the thermal treatment was performed for 120 minutes.

First, referring to FIG. 2A, it can be confirmed that, when the Raman spectrum of $WSe_{2x}S_{2-2x}$ prepared by thermally treating $WSe_2$ with $H_2S$ while varying temperature from 600° C. to 1,100° C. is compared to $WSe_2$ that was not thermally treated with $H_2S$, $WSe_{2x}S_{2-2x}$ exhibits peaks indicating the presence of $WS_2$ along with peaks indicating the presence of $WSe_2$.

In particular, it can be confirmed that, by thermally treating $WSe_2$ with $H_2S$, a portion of $WSe_2$ is changed into $WS_2$ and thus a transition metal dichalcogenide alloy, such as $WSe_{2x}S_{2-2x}$, is formed. In addition, it can be confirmed that, with increasing temperature of thermal treatment of $WSe_2$ with $H_2S$, peaks of $WSe_2$ are reduced and peaks of $WS_2$ increase. Accordingly, it can be confirmed that a composition ratio of $WS_2$ increases with increasing thermal treatment temperature.

In addition, referring to FIG. 2B illustrating change in optical band gap, it can be confirmed that the optical band gap of $WSe_{2x}S_{2-2x}$ manufactured by thermally treating $WSe_2$ with H$_2$S varying temperature from 600° C. to 1,100° C. shifts from 1.62 eV (WSe$_2$) up to 1.97 eV (WS$_2$) with increasing thermal treatment temperature with H$_2$S. From such a result, it can be confirmed that a composition ratio of WS$_2$ increases with increasing thermal treatment temperature of WSe$_2$ with H$_2$S.

FIG. 3 illustrates Raman spectrum according to partial pressure conditions of hydrogen gas when a transition metal dichalcogenide alloy according to an embodiment of the present disclosure is thermally treated in a sulfur compound atmosphere.

In particular, Raman spectrum of a transition metal dichalcogenide alloy (WSe$_{2x}$S$_{2-2x}$) manufactured by thermally treating the transition metal dichalcogenide (WSe$_2$), which has been formed by atomic layer deposition according to an embodiment of the present disclosure, with a sulfur compound (H$_2$S) varying temperature from 1,000° C. to 1,150° C. and a hydrogen gas partial pressure condition from 5 sccm to 25 sccm is illustrated in FIG. 3.

In FIG. 3, a temperature condition upon the thermal treatment and a hydrogen gas partial pressure condition are illustrated as "temperature value ° C.-hydrogen gas partial pressure value." For example, "1,000° C.-5" refers to a temperature condition of 1,000° C. and a hydrogen gas partial pressure condition of 5 sccm.

In addition, thermal treatment with a sulfur compound (H$_2$S) was performed at an H$_2$S supply rate of 10 sccm and at an argon supply rate of 50 sccm, other than the aforementioned temperature conditions and hydrogen gas partial pressure conditions.

Referring to FIG. 3, when WSe$_2$ was thermally treated at 1,000° C. or less in an H$_2$S atmosphere, a remarkable change in Raman spectrum dependent upon change in the partial pressure of hydrogen gas was not investigated.

On the other hand, when WSe$_2$ was thermally treated at 1,100° C. or more in an H$_2$S atmosphere, a change in Raman spectrum was observed with increasing partial pressure of hydrogen gas.

In particular, it can be conformed that, when WSe$_2$ is thermally treated with H$_2$S at 1,100° C. or more, peaks of WSe$_2$ are reduced and peaks of WS$_2$ increase, with increasing partial pressure of hydrogen gas.

That is, it can be confirmed that, when WSe$_2$ is thermally treated with H$_2$S at 1,100° C. or more, a conversion efficiency of WSe$_2$ into WS$_2$ increases with increasing partial pressure of hydrogen gas, and thus, a composition ratio of WS$_2$ increases.

FIG. 4 illustrates Raman spectrum according to partial pressure conditions of a sulfur compound when a transition metal dichalcogenide alloy according to an embodiment of the present disclosure is thermally treated in a sulfur compound atmosphere.

In particular, the Raman spectrum of a transition metal dichalcogenide alloy (WSe$_{2x}$S$_{2-2x}$) manufactured by thermally treating the transition metal dichalcogenide (WSe$_2$), which has been formed by atomic layer deposition according to an embodiment of the present disclosure, with a sulfur compound (H$_2$S) varying a partial pressure condition of a sulfur compound from 10 sccm to 20 sccm is illustrated in FIG. 4.

In FIG. 4, symbol "A" refers to an H$_2$S partial pressure condition at 10 sccm, and symbol "B" refers to an H$_2$S partial pressure condition at 20 sccm.

In addition, thermal treatment with a sulfur compound (H$_2$S) was performed at 1,100° C. for 30 minutes at a hydrogen gas supply rate of 25 sccm and at an argon gas supply rate of 50 sccm, other than the aforementioned sulfur compound partial pressure conditions.

Referring to FIG. 4, it can be confirmed that, when WSe$_2$ is thermally treated at 1,100° C. in an H$_2$S atmosphere, Raman spectrum changes with increasing H$_2$S partial pressure.

In particular, it can be confirmed that, when WSe$_2$ is thermally treated with H$_2$S at 1,100° C., peaks of WSe$_2$ are reduced and peaks of WS$_2$ increase, with increasing H$_2$S partial pressure from 10 sccm (A) to 20 sccm (B).

That is, it can be confirmed that, when WSe$_2$ is thermally treated with H$_2$S, conversion efficiency of WSe$_2$ into WS$_2$ increases with increasing partial pressure, and thus, a composition ratio of WS$_2$ increases.

According to an embodiment of the present disclosure, when transition metal dichalcogenide, which has been formed on a substrate by atomic layer deposition, is thermally treated with a sulfur compound, an ingredient ratio of the transition metal dichalcogenide alloy may be easily controlled by controlling a process condition such as a temperature condition, a partial pressure condition of a sulfur compound, or a partial pressure condition of hydrogen gas.

In particular, a band gap of the transition metal dichalcogenide alloy may be controlled by controlling an ingredient ratio of the transition metal dichalcogenide alloy, and thus, a band gap of the transition metal dichalcogenide alloy may be finely controlled in a range of 1.62 eV to 1.97 eV.

Hereinafter, a composition of the transition metal dichalcogenide alloy manufactured by the method according to an embodiment of the present disclosure is described in detail.

The transition metal dichalcogenide alloy manufactured by the method according to an embodiment of the present disclosure has a composition represented by Formula 1 below:

$$TS_{2x}C_{2-2x} \qquad \text{<Formula 1>}$$

wherein T is tungsten (W), molybdenum (Mo), or hafnium (Hf), S is sulfur (S), C is selenium (Se) or tellurium (Te), and x is 0.05 to 0.95.

In particular, Formula 1 of the transition metal dichalcogenide alloy according to an embodiment of the present disclosure may be WS$_{2x}$Se$_{2-2x}$, WS$_{2x}$Te$_{2-2x}$, MoS$_{2x}$Se$_{2-2x}$, MoS$_{2x}$Te$_{2-2x}$, HfS$_{2x}$Se$_{2-2x}$, or HfS$_{2x}$Te$_{2-2x}$.

In addition, in Formula 1, x may be greater than 0 and less than 1, for example, 0.05 to 0.95.

According to an embodiment of the present disclosure, a transition metal dichalcogenide alloy having a composition represented by Formula 1 may be formed to have various ingredient ratios depending upon change in the x value.

In particular, when the x value increases, an ingredient ratio of sulfur increases and, at the same time, an ingredient ratio of chalcogen decreases. On the other hand, as the x value decreases, an ingredient ratio of sulfur decreases and, at the same time, an ingredient ratio of chalcogen increases.

For example, when, in Formula 1, T is tungsten (W), S is sulfur (S), C is selenium (Se), and x is 0.48, a transition metal dichalcogenide alloy according to an aspect of the present disclosure may have a composition of WS$_{0.96}$Se$_{0.04}$.

According to an embodiment of the present disclosure, an ingredient ratio of a transition metal dichalcogenide alloy may be easily controlled by controlling a process condition, such as a temperature condition, a partial pressure condition of a sulfur compound, or a partial pressure condition of a hydrogen gas, when the transition metal dichalcogenide, which has been formed on a substrate by atomic layer deposition, is thermally treated with a sulfur compound.

Accordingly, a band gap of the transition metal dichalcogenide alloy may be finely controlled in a range of 1.62 eV to 1.97 eV.

According to an embodiment of the present disclosure, transition metal dichalcogenide may be deposited on a substrate uniformly over a large area, using atomic layer deposition (ALD).

According to another embodiment of the present disclosure, when transition metal dichalcogenide, which has been formed on a substrate by atomic layer deposition, is thermally treated with a sulfur compound, a transition metal dichalcogenide alloy, an ingredient ratio of which is easily controlled, may be manufactured. Further, since an ingredient ratio of the transition metal dichalcogenide alloy may be controlled, a band gap of the transition metal dichalcogenide alloy may be finely controlled in a range of 1.62 eV to 1.97 eV.

Although the present invention has been described through limited examples and figures, the present invention is not intended to be limited to the examples. Those skilled in the art will appreciate that various modifications, additions and substitutions are possible, without departing from the scope and spirit of the invention.

It should be understood, however, that there is no intent to limit the invention to the embodiments disclosed, rather, the invention is to cover all modifications, equivalents, and alternatives falling within the spirit and scope of the invention as defined by the claims.

What is claimed is:

1. A method of manufacturing a transition metal dichalcogenide alloy, the method comprising:
   depositing transition metal dichalcogenide on a substrate using atomic layer deposition (ALD); and
   forming a transition metal dichalcogenide alloy by thermally treating the transition metal dichalcogenide deposited on the substrate with a sulfur compound,
   wherein the thermally treating of the transition metal dichalcogenide deposited on the substrate is performed at 1,100° C. or more,
   wherein, in the forming of the transition metal dichalcogenide alloy, hydrogen ($H_2$) gas is additionally supplied while the thermally treating of the transition metal dichalcogenide deposited on the substrate is performed, and
   wherein the sulfur compound is supplied at a rate of 10 sccm to 50 sccm and the hydrogen ($H_2$) gas is supplied at a rate of 20 sccm to 50 sccm while the thermally treating of the transition metal dichalcogenide deposited on the substrate is performed.

2. The method according to claim 1, wherein the transition metal dichalcogenide is composed of any one transition metal, which is selected from the group consisting of tungsten (W), molybdenum (Mo), and hafnium (Hf), and any one chalcogen, which is selected from selenium (Se) and tellurium (Te).

3. The method according to claim 1, wherein the sulfur compound is any one selected from the group consisting of hydrogen sulfide ($H_2S$), dimethyl sulfide, diethyl sulfide, and dimethyl disulfide.

4. The method according to claim 1, wherein the atomic layer deposition is thermal atomic layer deposition (thermal ALD) or plasma enhanced atomic layer deposition (PEALD).

5. The method according to claim 1, wherein the thermally treating of the transition metal dichalcogenide is performed for 10 minutes to 120 minutes.

6. A transition metal dichalcogenide alloy having a composition, represented by Formula 1 below manufactured according to the method of claim 1:

$$TS_{2x}C_{2-2x}, \qquad \text{<Formula 1>}$$

wherein T is tungsten (W), molybdenum (Mo), or hafnium (Hf),
S is sulfur (S),
C is selenium (Se) or tellurium (Te), and
x is 0.05 to 0.95.

7. A transition metal dichalcogenide alloy having a composition, represented by Formula 1 below manufactured according to the method of claim 2:

$$TS_{2x}C_{2-2x}, \qquad \text{<Formula 1>}$$

wherein T is tungsten (W), molybdenum (Mo), or hafnium (Hf),
S is sulfur (S),
C is selenium (Se) or tellurium (Te), and
x is 0.05 to 0.95.

8. A transition metal dichalcogenide alloy having a composition, represented by Formula 1 below manufactured according to the method of claim 3:

$$TS_{2x}C_{2-2x}, \qquad \text{<Formula 1>}$$

wherein T is tungsten (W), molybdenum (Mo), or hafnium (Hf),
S is sulfur (S),
C is selenium (Se) or tellurium (Te), and
x is 0.05 to 0.95.

9. A transition metal dichalcogenide alloy having a composition, represented by Formula 1 below manufactured according to the method of claim 4:

$$TS_{2x}C_{2-2x}, \qquad \text{<Formula 1>}$$

wherein T is tungsten (W), molybdenum (Mo), or hafnium (Hf),
S is sulfur (S),
C is selenium (Se) or tellurium (Te), and
x is 0.05 to 0.95.

10. A transition metal dichalcogenide alloy having a composition, represented by Formula 1 below manufactured according to the method of claim 5:

$$TS_{2x}C_{2-2x}, \qquad \text{<Formula 1>}$$

wherein T is tungsten (W), molybdenum (Mo), or hafnium (Hf),
S is sulfur (S),
C is selenium (Se) or tellurium (Te), and
x is 0.05 to 0.95.

* * * * *